United States Patent
Zuppero et al.

(10) Patent No.: US 6,649,823 B2
(45) Date of Patent: Nov. 18, 2003

(54) GAS SPECIE ELECTRON-JUMP CHEMICAL ENERGY CONVERTER

(75) Inventors: Anthony C. Zuppero, Pollock Pines, CA (US); Jawahar M. Gidwani, San Francisco, CA (US)

(73) Assignee: NeoKismet, L.L.C., San Francisco, CA (US)

( * ) Notice: Subject to any disclaimer, the term of this patent is extended or adjusted under 35 U.S.C. 154(b) by 0 days.

(21) Appl. No.: 10/142,684

(22) Filed: May 10, 2002

(65) Prior Publication Data
US 2002/0121088 A1 Sep. 5, 2002

Related U.S. Application Data

(60) Continuation-in-part of application No. 10/038,257, filed on Oct. 24, 2001, which is a continuation of application No. 09/589,669, filed on Jun. 7, 2000, now Pat. No. 6,327,859, which is a division of application No. 09/304,979, filed on May 4, 1999, now Pat. No. 6,114,620.
(60) Provisional application No. 60/290,058, filed on May 10, 2001.

(51) Int. Cl.[7] .......................... H01L 31/00; H02N 11/00
(52) U.S. Cl. ................ 136/252; 136/253; 136/248; 136/291; 136/254; 136/205; 136/201; 310/300; 310/314; 310/322; 60/721; 60/532
(58) Field of Search ................. 136/253, 248, 136/291, 254, 252, 205, 201; 310/300, 314, 322; 60/721, 532

(56) References Cited

U.S. PATENT DOCUMENTS

| | | | |
|---|---|---|---|
| 4,045,359 A | * | 8/1977 | Fletcher et al. ............. 422/186 |
| 4,407,705 A | * | 10/1983 | Garscadden et al. ... 204/157.22 |
| 4,590,507 A | | 5/1986 | Capasso et al. |
| 4,686,550 A | | 8/1987 | Capasso et al. |
| 4,849,799 A | | 7/1989 | Capasso et al. |
| 5,293,857 A | | 3/1994 | Meyer |
| 5,311,009 A | | 5/1994 | Capasso et al. |
| 5,408,967 A | | 4/1995 | Foster |
| 6,084,173 A | | 7/2000 | DiMatteo |
| 6,114,620 A | | 9/2000 | Zuppero et al. |
| 6,119,651 A | | 9/2000 | Anderson |
| 6,218,608 B1 | * | 4/2001 | Zuppero et al. ............. 136/253 |
| 6,222,116 B1 | * | 4/2001 | Zuppero et al. ............. 136/253 |
| 6,232,546 B1 | | 5/2001 | DiMatteo et al. |
| 6,268,560 B1 | * | 7/2001 | Zuppero et al. ............. 136/253 |

(List continued on next page.)

OTHER PUBLICATIONS

Auerbach, Daniel J.; "Hitting the Surface—Softly"; Science, 294, (2001), pp. 2488–2489.
Bondzie, V. A., et al.;; "Oxygen adsorption . . . gold particles . . . TiO2(110)"; J. Vac. Sci. Tech. A., (1999) 17, pp. 1717 and figure 3.

(List continued on next page.)

Primary Examiner—Alan Diamond
(74) Attorney, Agent, or Firm—Baker & McKenzie

(57) ABSTRACT

An apparatus and method for extracting energy is provided. In one aspect the method includes using chemical reactions to generate vibrationally excited molecules, such as high-quantum-number-vibrationally-excited gas molecules in a region. The vibration energy in the vibrationally excited molecules is converted into hot electrons when the excited molecules contact a conductor. A geometry is provided so that the excited molecules may travel, diffuse or wander into a conductor before loosing a useful fraction of the vibrational energy. Optionally, the generating and the converting process may be thermally separated, at least in part. The short lived hot electrons are converted into longer lived entities such as carriers and potentials in a semiconductor, where the energy is converted into a useful form.

37 Claims, 8 Drawing Sheets

U.S. PATENT DOCUMENTS

| | | | | |
|---|---|---|---|---|
| 6,327,859 B1 | * | 12/2001 | Zuppero et al. | 60/721 |
| 2001/0018923 A1 | * | 9/2001 | Zuppero et al. | 136/248 |
| 2002/0017827 A1 | | 2/2002 | Zuppero et al. | |
| 2002/0070632 A1 | * | 6/2002 | Zuppero et al. | 310/301 |
| 2002/0196825 A1 | * | 12/2002 | Zuppero et al. | 372/39 |
| 2003/0000570 A1 | * | 1/2003 | Zuppero et al. | 136/252 |

OTHER PUBLICATIONS

Boulter, James; "Laboratory Measurement of OH . . . "; http://pearl1.lanl.gov/wsa2002/WSA2002talks.pdf (2002).

Chan H.Y.H., et al.; Methanol Oxidation On Palladium Compared To Rhodium . . . ; J. Catalysis v. 174(#2) pp. 191–200 (1998) (abstract and figure 1 only).

Chiang, T.–C.; Photoemission studies of quantum well states in thin films; Surf. Sci. Rpts.39 (2000) pp 181–235.

Chubb, D. L., et al.; "Semiconductor Silicon as a Selective Emitter"; http://www.thermopv.org/TPV5–2–05–Chubb.pdf (abstract only) (Date Unknown).

Corcelli, S. A., et al.; "Vibrational energy pooling in CO on NaCl(100) . . . "; J. Chem. Phys.(2002) 116, pp 8079–8092.

Danese, A., et al.; "Influence of the substrate electronic structure on metallic quantum well . . . "; Prog. Surf. Sci., 67, (2001), pp 249–258.

Davis, J. E., et al.; "Kinetics and dynamics of the dissociative chemisorption of oxygen on Ir(111)"; J. Chem. Phys. 107 (3), (1997), pp 943–952.

Diekhoner, L., et al.; "Parallel pathways in methanol . . . Pt(111)"; Surf. Sci. 409 (1998) pp. 384–391.

Diesing, D., et al.; "Aluminium oxide tunnel junctions . . . "; Thin Solid Films, Vol. 342 (1–2) (1999) pp. 282–290.

Dimatteo, R. S., et al.; "Enhanced photogeneration of carriers . . . vacuum gap"; Appl. Phys. Let. (2001) 79, pp. 1894–1896.

Dimatteo, R. S., et al.; "Introduction to and Experimental Demonstration of Micron–gap ThermoPhoto Voltaics"; http://www.thermopv.org/37DiMatteo.html (abstract only) (Date Unknown).

Dogwiler, Urs, et al.; "Two–dimensional . . . catalytically stabilized . . . lean methane–air . . . "; Combusition and Flame, (1999), 116(1,2), pp 243–258.

Echenique, P. M., et al.; "Surface–state electron dynamics in noble metals"; Prog. Surf. Sci., 67, (2001), pp 271–283.

Endo, Makoto, et al.; "Oxidation of methanol . . . on Pt(111) . . . "; Surf. Sci. 441 (1999) L931–L937, Surf. Sci. Letters.

Fan, C. Y., et al.; "The oxidation of CO on RuO2 . . . "; J. Chem. Phys. 114, (2001), pp. 10058–10062.

Fann, W.S., et al.; "Electron thermalization in gold"; Phys. Rev. B (1992) 46 pp 13592–13595.

Gee, Adam T., et al.; "The dynamics of O2 adsorption on Pt(533) . . . "; J. Chem. Phys.(2000) 113, pp 10333–10343.

Gergen, Brian, et al.; "Chemically Induced Electronic Excitations at Metal Surfaces"; Science,294, (2001) pp. 2521–2523.

Guliants, Elena A, et al.; "A 0.5–82 m–thick polycrystalline silicon Schottky . . . "; Appl. Phys. Let., (2002), 80, pp. 1474–1476.

Gumhalter, B., et al.; "Effect of electronic relaxation . . . adsorption reaction rates"; Phys. Rev. B (1984) 30 pp. 3179–3190.

Halonen, Lauri, et al.; "Reactivity of vibrationally excited methane on nickel . . . "; J. Chem. Phys.(2001) 115, pp. 5611–5619.

Hasegawa, Y., et al.; Modificatiton of electron . . . standing wave . . . Pd . . . ; Surf. Sci., in press, Apr. 11, 2002.

Henry, Claude R.; "Catalytic activity . . . nanometer–sized metal clusters"; Applied Surf. Sci., 164, (2000) pp 252–259.

Hess, S., et al.; "Hot Carrier Relaxation . . . Phonon Scattering in GaN"; http://www.physics.ox.ac.uk/rtaylor/images/hot%20carrier%20poster.pdf (Date Unknown).

Ho, Wilson; http://www.lassp.cornell.edu/lassp_data/wilsonho.html (Data Unknown).

Hohlfeld, J, et al.; "Electron and lattice dynamics . . . optical excitation of metals"; Chemical Physics, 251 (2000) pp 237–258.

Honkala, Karoliina, et al.; "Ab initio study of O2 precursor states on the Pd(111) . . . "; J. Chem. Phys. (2001) 115, pp. 2297–2302.

Hou, H.; Y., et al.; "Chemical Interactions of Super–Excited Molecules on Metal Surfaces"; http://www2.chem.ucsb.edu/~wodtke/papers/dan.1.pdf (Date Unknown).

Hou, H., et al.; "Direct multiquantum relaxation of highly vibrationally excited NO . . . "; J. Chem. Phys., 110, (1999) pp 10660–10663.

Huang Y., et al.; "Observation of Vibrational Excitation and Deexcitation for NO from Au(111) . . . "; Phys. Rev. Lett., 84, (2000) pp 2985–2988.

Huang, Yuhui, et al.; "Vibrational Promotion of Electron Transfer"; SCIENCE, VOL 290, 6 Oct. 2000, pp 111–113.

IBH; "NanoLED overview"; http://www.ibh.co.uk/products/light_sources/nanoled_main.htm (Date Unknown).

IBH; "Red picosecond laser sources"; http://www.ibh.co.uk/products/light_sources/nanoled/heads/red_laser_heads.htm (Date Unkown).

Iftimia, Ileana, et al.; "Theory . . . scattering of molecules from surface"; Phys. Rev. B (2002) 65, Article 125401.

Ishikawa, Yasuyuki, et al.; "Energetics of H2O dissociation and COads+OHads reaction . . . Pt . . . "; Surf. Sci. preprints SUSC 12830, Apr. 27, 2002.

Johnson, R. Colin; "Molecular substitution . . . terahertz switch arrays"; EE Times, (Apr. 10, 2000, 3:35 p.m. EST) http://www.eet.com/story/OEG20000410S0057.

Kao, Chia–Ling, et al.; "The adsorption . . . molecular carbon dioxide on Pt(111) and Pd(111)"; Surf. Sci., (2001) Article 12570.

Katz, Gil, et al.; "Non–Adiabatic Charge Transfer Process of Oxygen on metal Surfaces"; Surf. Sci. 425(1) (1999) pp. 1–14.

Kawakami, R. K., et al.; "Quantum–well states in copper thin films"; Nature, 398, (1999) pp 132–134.

Komeda, T., et al.; "Lateral Hopping of Molecules Induced by Excitation of Internal Vibration . . . "; Science, 295, (2002) pp 2055–2058.

Lewis, Steven P., et al.; "Continuum Elastic Theory of Adsorbate Vibrational Relaxation"; J. Chem. Phys. 108, 1157 (1998).

Lewis, Steven P., et al.; "Substrate–adsorbate coupling in CO–adsorbed copper"; Phys. Rev. Lett. 77, 5241 (1996).

Li, Shenping, et al.; "Generation of wavelength–tunable single–mode picosecond pulses . . . "; Appl. Phys. Let. 76, (2000) pp 3676–3678.

Mitsui, T., et al.; "Coadsorption and interactions of O and H on Pd(111)"; Surf. Sci., Article 12767, (2002).

Moula, Md. Golam, et al.; "Velocity distribution of desorbing CO2 in CO oxidation on Pd(110) . . . "; Applied Surf. Sci., 169–170, pp 268–272 (2001).

Mulet, Jean–Philippe, et al.; "Nanoscale radiative heat transfer between a small particle . . . "; Appl. Phys. Let., 78, (2001) p 2931.

Nienhaus, H, et al.; "Direct detection of electron–hole pairs generated by chemical reactions on metal surfaces"; Surf. Sci. 445 (2000) pp 335–342.

Nienhaus, H.; "Electronic excitations by chemical reactions on metal surfaces"; Surf. Sci. Rpts. 45 (2002) pp 1–78.

Nienhaus, H., et al.; "Selective H atom sensors using ultrathin Ag/Si Schottky diodes"; Appl. Phys. Let. (1999), 74, pp. 4046–4048.

Nienhaus, Hermann; "Electron–hole pair creation by reactions at metal surfaces"; APS, Mar. 20–26, 1999, Atlanta, GA, Session SC33 [SC33.01].

Nienhaus, H., et al.; "Electron–Hole Pair Creation at Ag and Cu . . . of Atomic Hydrogen and Deuterium"; Phys. Rev. Lett., 82, (1999) pp. 446–449.

Nolan, P. D., et al.; "Direct verification of . . . precursor to oxygen dissociation on Pd(111)"; Surf. Sci. v. 419(#1) pp. L107–L113, (1998).

Nolan, P. D., et al.; "Molecularly chemisorbed intermediates to oxygen adsorption on Pt . . . "; J. Chem. Phys. 111, (1999), pp 3696–3704.

Nolan, P. D., et al.; "Translational . . . Precursors to Oxygen Adsorption on Pt(111)"; Phys. Rev. Lett., 81, (1998) pp 3179–3182.

Ogawa, S., et al.; "Optical . . . and Femtosecond Dynamics in Ag/Fe(100) Quantum Wells"; Phys. Rev. Lett. 88, 116801 (2002).

Paggel, J. J., et al.; "Quantum–Well States as Fabry–Pérot Modes in a . . . "; Science, 283, (1999), pp 1709–1711.

Paggel, J. J., et al.; "Quasiparticle Lifetime . . . Ag/Fe(100) Quantum Wells"; Phys. Rev. Lett. (1998) 81, pp. 5632–5635.

Paggel, J.J., et al.; "Quantum well photoemission from atomically uniform Ag films . . . "; Applied Surf. Sci., 162–163, (2000), pp 78–85.

Reitner, C. T., et al.; "Dynamics . . . chemisorption of O2 on Pt(111) . . . chemisorbed precursor . . . "; J. Chem. Phys. (1991) 94, pp. 1626–1635 (abstract only).

Rinnemo, Mats; "Catalytic Ignition and Kinetic Phase Transitions"; 1996; http://www2.lib.chalmers.se/cth/dis/doc/9596/RinnemoMats.html.

Robertson, A. J. B.; "Catalysis of Gas Reactions by Metals"; Logos Press Limited; 1970; LC #70–80936; pp. 1–5, 10, 41; Great Britain, Adlard & son Ltd.

Schewe, P., et al.; "CO2 Production at the Single–Molecule Level"; http://www.air.org/enews/physnews/2001/split/561–1.html (2001).

Sheng, H., et al.; "Schottky diode with Ag on (110) epitaxial ZnO film"; Appl. Phys. Let. (2002) 80, pp. 2132–2134.

Smit, G. D. J., et al.; "Enhanced tunneling across nanometer–scale metal–semiconductor interfaces"; Appl. Phys. Let.(2002) 80, pp. 2568–2570.

Snow, E. S., et al.; "Ultrathin PtSi layers patterned by scanned probe lithography"; Appl. Phys. Let. (2001) 79, pp. 1109–1111.

Stipe, B. C., et al.; "Atomistic studies of O2 dissociation on Pt(111) induced by photons . . . "; J. Chem. Phys., (1997) 107 pp. 6443–6447.

Sun, C.–K., et al.; "Femtosecond studies of carrier dynamics in InGaN"; Appl. Phys. Let. (1997) 70 pp. 2004–2006.

Svensson, K., et al.; "Dipole Active Vibrational Motion in the Physisorption Well"; Phys. Rev. Lett., 78, (1997) pp 2016–2019.

Tarver, Craig M.; "Non–Equilibrium Chemical Kinetic . . . Explosive Reactive Flows"; Fall 1999 IMA Workshop: High–Speed Combustion in Gaseous and Condensed–Phase.

Taylor, R.A., et al.; "Strong Electron–LO Phonon Scattering and Hot Carrier Relaxation in GaN"; http://www.physics.ox.ac.uk/rtaylor/images/ha249kw3.pdf (Date Unknown).

Teodorescu, C.M., et al.; "Structure of Fe layers grown on InAs . . . "; Appl. Surf. Sci., 166, (2000) pp 137–142.

Tiusan, C., et al.; "Quantum coherent transport versus diode– like effect in . . . "; Appl. Phys. Let. 79, (2001) pp 4231–4233.

Tripa, C. Emil, et al.; "Surface–aligned photochemistry: Aiming reactive oxygen atoms . . . "; J. Chem. Phys., (2000) 112 pp. 2463–2469.

Tripa, C. Emil, et al.; "Surface–aligned reaction of photo-generated oxygen atoms with . . . "; Nature 398, pp 591–593 (1999).

Tripa, C. Emil; "Special Adsorption and Reaction Effects at Step Defect Sites on Platinum . . . "; http://www.chem.pitt.edu/thesis.html#tripa (abstract only) (Date unknown).

Volkening, S., et al.; "CO oxidation on Pt(111)—Scanning tunneling microscopy experiments . . . "; J. Chem. Phys. (2001) 114, pp. 6382–6395.

Watson, D.T.P., et al.; "Isothermal and temperature–programmed oxidation of CH over Pt . . . "; Surf. Sci. preprint, year 2001.

Watson, D.T.P., et al.; "Surface products of the dissociative adsorption of methane on Pt . . . "; Surf. Sci. preprint, c. Oct. 2001.

Wilke, Steffen, et al.; "Theoretical investigation of water formation on Rh and Pt Surfaces"; J. Chem. Phys., 112, (2000) PP 9986–9995.

Wintterlin, J, et al.; "Atomic . . . Reaction Rates . . . Surface–Catalyzed . . . "; Science, 278, (1997) pp. 1931–1934.

Wintterlin, J, R., et al.; "Existence of a "Hot"Atom Mechanism for the Dissociation of O2 on Pt(111)"; Phys. Rev. Lett., 77, (1996), pp 123–126.

Zambelli, T., et al.; "Complex pathways in dissociative adsorption of oxygen on platinum"; Nature 390, pp 495–497 (1997).

Zhdanov, V.P., et al.; "Substrate–mediated photoinduced chemical reactions on ultrathin metal films"; Surf. Sci., V. 432 (#3) pp L599–L603, (1999).

Zhdanov, Vladimir P.; "Nm–sized metal particles on a semiconductor surface, Schottky . . . "; Surf. Sci. PROOF SUSC 2931, Apr. 20, 2002.

Zhukov, V. P., et al.; "Lifetimes of quasiparticle excitations in 4d transition metals . . . "; Phys. Rev. B (2002) 65, Article 115116.

* cited by examiner

GAS SPECIE ELECTRON-JUMP CHEMICAL ENERGY CONVERTER

CROSS REFERENCE TO RELATED APPLICATIONS

This application claims the benefit of U.S. Provisional Patent Application No. 60/290,058, filed on May 10, 2001, which application is incorporated herein by reference in its entirely. This application is a continuation-in-part of U.S. patent application Ser. No. 10/038,257 pending filed on Oct. 24, 2001, which is a continuation of U.S. patent application Ser. No. 09/589,669, filed on Jun. 7, 2000, now U.S. Pat. No. 6,327,859, which is a divisional of U.S. patent application Ser. No. 09/304,979, filed on May 4, 1999, now U.S. Pat. No. 6,114,620.

TECHNICAL FIELD OF THE INVENTION

The invention relates generally to a method and device to convert chemical reaction energy directly into electric power, and more specifically to a method and device to generate vibrationally highly excited reaction products and to convert the product energy directly into useful forms, such as electricity, hot electrons in a metal surface, long lived carriers in a semiconductor, radiation or coherent radiation.

BACKGROUND OF THE INVENTION

The fuel cell is a clean and efficient electrochemical energy conversion method that typically converts chemical reaction energy of reactant gases directly and efficiently into electricity. The power per mass or per volume exhibited by a fuel cell system, however, is typically at least an order of magnitude lower than that of mechanical engines. Further, the volume needed for a fuel cell using liquid, storable fuels to generate the power of a given battery is typically significantly larger than that of the battery. This means that the present form of fuel cells cannot replace the battery regardless of the fuel cell efficiency, because there is no room for fuel.

In addition, the type of fuel cell with the highest known power per mass, the solid oxide fuel cell, operates at temperatures of 600 to 800 Celsius. Operation at this temperature presents materials problems as a result. In principle, this fuel cell would exhibit the power density required to operate in the volume of a battery it would displace. Thermal issues, however, have dominated and prevented realization of this goal.

The alternative to a high performance fuel cell is a rotating mechanical device. However, mechanical engines generating electricity must typically use coil and magnet devices to convert mechanical energy into electrical energy and are therefore relatively heavy, with power densities less than 2 watts per gram.

Therefore, there is a need to have a method and system for converting chemical energy directly and efficiently into electricity and to have methods that do not require high temperatures and materials and that do not require relatively heavy mechanical devices.

A chemical reaction typically creates highly vibrationally excited specie, which reaction may be stimulated by catalysts, injection of autocatalysts, or other means. A substantial fraction of the excitation energy may be transferred to an energetic electron in a metal when the excited specie comes in contact with the metal. See Huang, Yuhui; Charles T. Rettner, Daniel J. Auerbach, Alec M. Wodtke, Science, Vol. 290, 6 October 2000, pp 111–113, "Vibrational Promotion of Electron Transfer."

According to results of experiments, vibrationally excited anions may absorb an electron and re-emit an electron into the lattice, carrying with it most of the excitation energy. By analogy, cations may emit an electron and reabsorb it, emitting a hole into the lattice, with the hole carrying the energy. The electron or hole is the hot carrier.

Recent experimental observations and theoretical developments in surface science confirmed that even relatively weakly electronegative gas molecules vibrating with an energy almost sufficient to break their chemical bonds (vibration quantum number in excess of order 15) can deposit a majority of the vibration energy into an electron of the metal surface during a single, brief contact (of order 0.1 picoseconds) with that surface. Research and observations associated with understanding this observation support the theory of prompt, multi-quantum energy transfer to a single electron from a vibrationally excited chemical specie.

Typically, more than half of the vibrational mode energy will be transferred directly into an electron of the metal surface with an energy greater than approximately 5 vibrational quanta. The result is that an electron in a metal surface may carry away a substantial, useful fraction of the vibrationally excited molecule energy as a hot electron, also referred to as a hot carrier.

In the metal, the hot electron may travel into a semiconductor. The hot electron becomes converted into an excitation or potential difference in the semiconductor where it may be converted into other useful forms such as an electrical potential driving a current in an external circuit, an inverted population of semiconductor excitations, or hot carriers transported to other locations for use.

The hot electron may be converted into a potential in a semiconductor. For example, U.S. Pat. No. 6,222,116 collects such hot electrons directly without mechanical means, and converts them directly into electricity when the vibrationally excited chemical product specie is formed on or within a few molecule dimensions of the reaction surface of its device. The device described in this patent generates useful electricity by causing the reactions rates to be sufficiently high to energize the semiconductor converter into maintaining a useful forward bias.

A removal of spent reaction products through desorption from a hot-electron collection surface may enhance this high reaction rate. De-energized molecules desorbing may leave behind a clean site for more reactions. Allowing these de-energized molecules to migrate away from the conducting surface may initiate further reaction with more oxidizers and fuels.

Accordingly, there is a need to have a method to produce vibrationally highly excited specie directly from chemical reactions and where the conversion of the electrical energy of the excited specie may take place at a location different from in the thermal sense and separated from the creation of the excited specie. Further, there is a further need to have reactions take place in a volume, not just a surface, to increase the rate of reaction compared to that on a surface.

SUMMARY OF THE INVENTION

In one aspect, a method is provided to use chemical reactants to produce vibrationally excited gas molecules in a reaction volume or region, and to extract a substantial fraction of energy, for example, as hot electrons in a conducting surface, and to convert the energy, such as hot electrons, into useful forms of energy.

The method includes using chemical reactions to generate vibrationally excited molecules such as high quantum number vibrationally excited gas molecules. The vibration energy in the vibrationally excited molecules is converted into hot electrons when the excited molecules contact a conductor. A geometry such as a gas reaction region with dimensions of order several molecular collision mean free paths and bounded in part by a conducting surface is provided so that the excited molecules may travel, diffuse or wander into a conductor before loosing a useful fraction of the vibrational energy. Optionally, the generating and the converting process may be thermally separated, at least in part. The short lived hot electrons are converted into longer lived entities such as carriers and potentials in a semiconductor, where the energy is converted into a useful form.

In another aspect, an apparatus for generating energy provided includes a reaction region where the reactants, for example, fuel and oxidizer, undergo chemical reactions that produce highly vibrationally excited molecules. Exhausts produced in the reaction are allowed to leave the system. A reaction region may be close enough to the collection surface so that the excited products do not loose a substantial fraction of their energy before reaching the collection surface. A collection surface may include a surface such as a conductor near or on which excited products transfer energy to a hot electron or carrier (electron or hole). A conversion region may be in contact with the collection surface, where the hot electron or carrier is converted into a useful form, such as a potential in a semiconductor sustained by separated carriers. This conversion region may be at least partly isolated at least thermally from the reaction region.

Yet in another aspect, the method may include transferring reaction product excitations such as multiple-quantum change of energy of a dipole active state of a vibrational state, which are a type of excitation of the energized chemical products.

Further features and advantages of the invention as well as the structure and operation of various embodiments of the invention are described in detail below with reference to the accompanying drawings. In the drawings, like reference numbers indicate identical or functionally similar elements.

BRIEF DESCRIPTION OF THE DRAWINGS

Embodiments of the invention will now be described, by way of example only, with reference to the accompanying drawings in which.

DETAILED DESCRIPTION OF THE INVENTION

Figure 1:
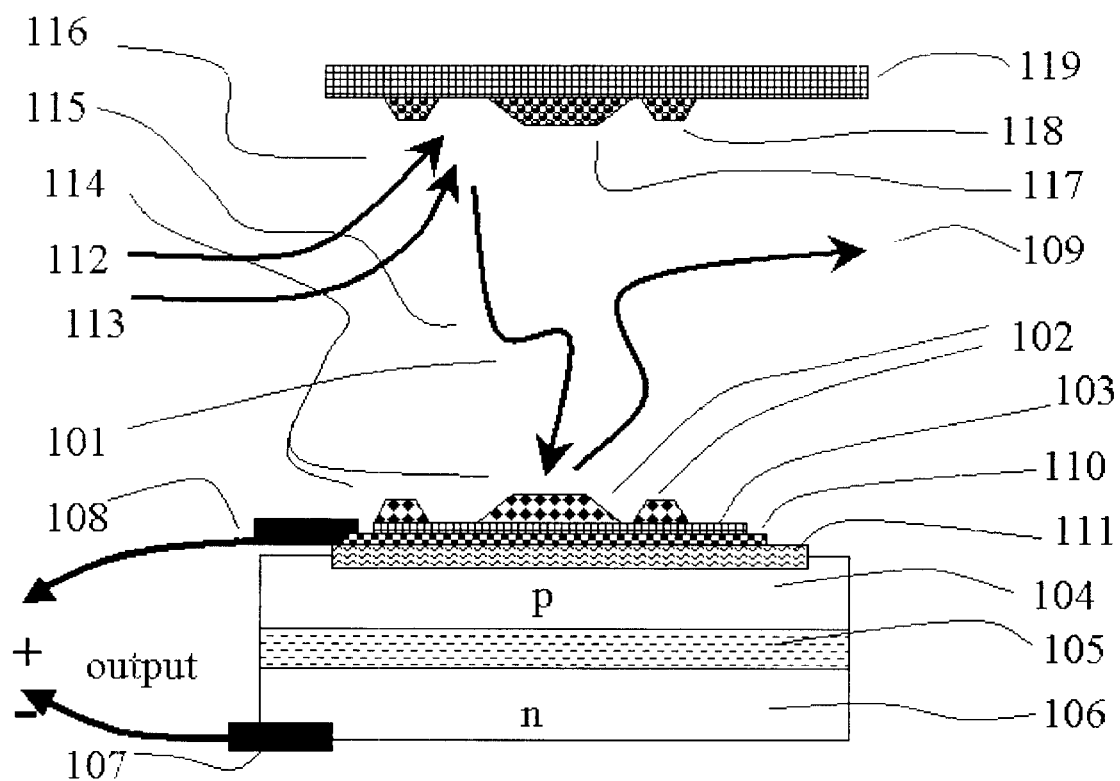
FIG. 1 shows a schematic cross section of an apparatus where a separated reaction region generates energized molecules and a collection region collects the energy from the energized molecules.

In one aspect, the method and apparatus provided enhance the peak power and the rate of energy conversion and further enhance the desorption of exhaust and contamination products from the conducting surface. The method, in one aspect, includes choosing catalysts with relatively low affinity for exhaust products. Such catalysts include platinum, palladium and related catalysts have shown this property with respect to hydrogen and alcohol combustion.

In another aspect, the method includes bringing fuel and oxidizer into the reaction region and permitting exhaust products to leave the reaction region. Exhaust products may migrate and diffuse away. One way to allow the exhaust products to migrate and diffuse away includes flowing gaseous reactants over the reaction surface and letting the exhaust products leave the surface into the gas flow. In another aspect, the apparatus provided may be designed to generate a single, one time pulse of power, in which case the exhaust products need not leave the reaction region.

The method provided may include using energized molecules that have migrated through a gas reaction volume to a conducting surface. When the energized molecules interact with the conducting surface they give up a substantial fraction of the chemical vibration energy to the conducting surface in the form of an energetic, ballistic electron. The conducting surface is formed sufficiently thin to permit the ballistic electron to migrate and diffuse directly into a semiconductor substrate. The semiconductor converts the electron energy into a storable, useful form with a much longer lifetime (e.g. picoseconds or longer) than the lifetime of a ballistic electron (e.g. 0.01 picoseconds). Typically, the semiconductor is formed into a diode and the useful form of energy is the generation of electricity as a forward bias in the diode.

A conducting surface may include catalysts and/or catalyst metals so that reactions on the catalyst continuously remove adsorbates and provide clean metal with which vibrationally excited gas specie may interact. Additives supplied with fuel and/or oxidizer may supply the catalysts. Oxidizing reactions are known to be effective to remove adsorbed, unreacted specie. Nearly all fuel-air reactions are oxygen rich, tending to favor or permit favoring such oxidizing reactions for surface self cleaning.

A conducting surface may be considered to be conducting even when a monolayer of reactive adsorbate resides on that surface. Such adsorbates include oxygen and fuel molecules. Generally, a fraction of a monolayer of oxide may form on catalyst conducting surfaces.

In one aspect, the apparatus provided may use fuel and oxidizer to create the energized molecules in the vicinity of a conducting surface. In addition, highly vibrationally excited specie may be generated in the vicinity of a conducting surface by reaction of fuel, such as methanol, hydrogen, or partially oxygenated and complex hydrocarbons, and an oxidizer, such as air. Fuels from any one of any reducing material or electron donor may be chosen, including but not limited to hydrogen, hydrocarbons, complex hydrocarbons, alcohols such as methanol, ethanol and propanol, carbohydrates, partially oxygenated hydrocarbons, diesel fuel, kerosene, volatized products of organic matter, the products of a fuel reformer such as hydrogen and carbon monoxide, and combustible gasses including ammonia. Oxidizers may include any one of electron acceptors, oxygen, air, hydrogen peroxide and halogens. In another aspect, reactants, whether or not they are considered fuels and oxidizers, may also be used. Thus, any reaction that produces vibrationally excited specie that may migrate to a collection region may be used as the source of energy.

Other examples of reactants include such combinations as alkali metals and water, where the exhaust would include alkali oxides and hydrogen. Yet more example of reactants may include chemical reactants where the fuel and oxidizer are one and the same, unstable molecule. Examples of such chemical reactants include monopropellants such as MMH, mono methyl hydrazine.

In one aspect, vibrationally excited specie may be produced by any one of many known processes. The vibrationally excited specie may include partially reacted chemical specie, such as the reaction intermediates including hydroxyl radicals OH, CO, and HCO. These intermediates may include other, non-reactive specie such as exhausts, and air molecules such as nitrogen or oxygen. These intermediates may acquire vibrational energy from the reactants and their byproducts. Resonant vibrational transfer is just one way of energizing the intermediates.

To form vibrationally excited specie via the Eley-Rideal process, chemically reactive free radicals, such as atomic hydrogen and oxygen may be allowed to impinge on adsorbed oxygen or fuel on the catalyst or conductor surface. Reactants may also form on the metal surface and react, for example, via Langmuir-Hinshelwood process.

In one aspect, the energized molecules may be created by reacting fuels and air with the aid of catalysts and stimulators and by using reaction geometries that form vibrationally excited gaseous molecules at any locations where they may readily migrate and diffuse to a conducting surface before loosing a substantial amount of excitation.

During operation, known stimulation devices such as catalysts, reaction stimulator methods, and additives may be used to produce vibrationally excited specie after reactants enter a region of reaction. Stimulator methods include using one or more catalysts, catalysts on a reaction surface, electric discharges, gliding electric discharges, optical and photolytic methods, optical devices, and injected catalysts, catalytic or autocatalyst materials. The stimulation device may generate free radicals as stimulators, for example, using electrical or optical energy.

Since most stable chemical reactions are activated (having a potential energy barrier that keeps reactants apart), the stimulation device may provide the activation energy using electrical means. The apparatus provided recovers a fraction of that energy.

Gaseous chemical reactions in a volume of fuel and oxidizer mixtures produce gas products whose initial state is one where the energy is concentrated substantially in the vibration mode. The vibration modes of a gas typically have lifetimes of 10's to 10,000's of gas kinetic collisions (for non-resonant interactions), and the pre-equilibrium mean free path for typical hydrocarbon—air reaction products are of order 50 to 200 nanometers in the gas. This means that reaction channels to take advantage of this mean free path would have dimensions as large as a dimension of order at least 10's to 100's of mean free paths (given by square root (3× vibration lifetime/time between collisions)) and would, therefore, have dimensions of order up to 20,000 nanometers (0.02 mm, 0.8 thousands of an inch). Such channels with dimension of order 1 or more mean free paths are practical to fabricate.

Even when vibration mode lifetimes would be as low as tens of mean free paths, metal walled surface features or channels to take advantage of them may have dimensions of order ½ micron. Features with these dimensions are readily constructed. Such channels or surface features may be, therefore, constructed to interact with the gas molecules before equilibrium degrades the energy. The vibrating molecule, therefore, may be made to collide with a metal wall before it reaches equilibrium with the other modes such as rotation and translation and at a distance removed from the energy collection and conversion surface.

The method provided includes using a volume or region for the chemical reactions. Using a volume or region may permit a reaction rate and corresponding output power to be much higher than using a surface. Many more reactions may occur in a volume or region than on a surface. The resulting volume reaction rate is typically orders of magnitude higher than the rate associated with a catalyst turnover number. The method maintains a high output power compared to surface reaction alternatives because reactions may be stimulated in a volume region while energy collection may be achieved in a surface region. Generally, the surface to volume ratio of a ½ micron sphere is high compared to that of macroscopic reaction volumes. Thus, using a volume may result in orders of magnitude increase in power compared to that of a surface reaction relying on surface catalysis alone.

The separation of high reaction rate, higher temperature volume region from the energy conversion region, a surface, is a feature that may permit complete electrical power systems with power per mass and power per volume performances approaching the gas kinetic limit, such as those in rocket engines and jet engines, and of order 10 to 500 watts per cc. Specifically, the conversion from chemical to electrical power with this method and apparatus provided does not require the mechanical generator (dynamo) required of jet engine and turbine systems, which generator adds considerable weight to the system.

In another aspect, the method provided includes thermally separating or isolating, at least partially, the reaction region, which generates heat, and the energy conversion region, which operates more efficiently at lower temperatures. Waste heat may also be conducted and convected away from the reaction region directly to the exhaust.

This isolation permits the energy converter to be maintained at a temperature lower than that of the reaction region. The conversion of hot electrons in the semiconductor connected to the conducting surface becomes more efficient exponentially as a function of decreasing temperature.

This thermal isolation also permits the reaction volume to be maintained at a higher temperature than the energy conversion device. Chemical reaction rates are typically accelerated exponentially as a function of temperature. This higher reaction rate permits supplying reactants at a rate consistent with the ability to pump reactants into the reaction region.

In another aspect, different parts of the region of reaction may be operated at elevated temperatures, for example, 600 C., to stimulate catalytic reactions and accelerate or sustain reaction rates.

The method and apparatus provided may use a geometry that generates highly vibrationally excited specie in the vicinity of a conducting surface. "Vicinity" here means within a distance less than several times the gas diffusion distance for highly vibrationally excited gas specie.

The term "close proximity to the conducting surface" refers to the case where the charges travel ballistically through space and may also refer to another case where the electric and magnetic fields related to the chemical specie are evanescent and not propagating waves, both of which dimensions are typically less than 1000 nanometers.

The diffusion distance is related to the characteristic distance over which the vibrational excitations travel before loosing a significant fraction of their energy, referred to here as a vibrational diffusion length. The vibrational diffusion length is approximately the 1-sigma distance of a three dimensional bell-curve probability distribution over which the specie will wander. A model of such diffusion states that the vibrational diffusion length is given by the product of the collisional mean free path by the square root of 3 times the ratio of vibrational lifetime to time between collisions. This vibrational diffusion length for S.T.P. air is typically much less than 20 microns and may typically be in excess of hundreds of nanometers.

In another aspect, the method converts short lived ballistic charge carriers such as hot electrons which typically have the lifetime of order 0.010 picosecond into longer lived carriers in a semiconductor whose lifetime typically is in excess of picoseconds.

In another aspect, the energy converter, such as the semiconductor or the quantum well in immediate contact with the substrate, converts the short-lived substrate hot carrier into a longer-lived carrier or excitation in the semiconductor or quantum well.

In another aspect, the method provided may inject or transfer the energetic charge carrier resulting from the interaction of a surface and the energized molecules, into a semiconductor diode to create an excess of excited carriers in that diode. This excess of excited carriers may also create a potential across the diode.

In another aspect, the apparatus provided may include a p-n junction diode. Hot electrons generated in the conducting surface travel through the surface and any intermediate material and enters a p-type semiconductor substrate. The conductor Fermi level ohmically or almost ohmically contacts the valence band (lower band) of the semiconductor. Therefore, hot electrons with energy greater than the band gap have energy greater than the conduction band (upper band) and become minority carriers in the conduction band. The conduction band electrons then migrate to the p-n junction and are attracted there by reason of the internal potential and therefore forward bias the diode to generate electricity. The polarity and bandgap of the semiconductor may be deliberately chosen such that the hot carrier becomes a minority carrier when the hot carrier is in the semiconductor.

In a p-n junction, for example, the longer lived minority carriers may then be used and converted into other useful forms. For example, the carriers may be converted into electricity. The carriers may be allowed to recombine into radiation or a coherent beam of radiation. Further, the carriers may diffuse to other locations of the device and provide stimulation carriers for further surface reactions. The carriers may be used to cause a mechanical effect in a nano-mechanical system and/or to provide carriers in a semiconductor that would otherwise be provided by a power supply. Accordingly, chemical energy may be converted into any one of many useful forms.

The method provided in one aspect may, therefore, include forming p-n junction diodes. Such diodes may be those that have one or both polarities that are heavily doped or degeneratively doped. The method provided may include forming doping gradients, which may broaden or narrow the junction region. It is known to those skilled in the art that applying a high peak power by using pulsed chemical reactions with p-n junctions formed by using low bandgap semiconductors may increase the efficiency, permitting using such small band gaps as those of order 0.05 to 0.1 eV.

It is recognized that the state of the art of constructing p-n junction diodes includes many variants. Such variants include various regions and combinations of metals, semiconductors, oxides and insulators outside of the diode. Some of these regions function to form ohmic or almost ohmic contacts to the diode. Other functions include lattice matching. The diode may be formed with many variants of doping profile. All such variants may be functionally the same: a p-n junction diode.

The method and apparatus provided may include using semiconductor compounds whose bandgap may be tailored by the choice of alloy composition. The tailoring may be applied near or at the junction of a conducting surface and the semiconductor converter, for example, to create a potential to sweep carriers into the semiconductor from the conducting surface. These semiconductors include the InGaAsSb family of semiconductors, where the band gap can range from approximately 0.1 eV to above 1.5 eV depending on the ratio of In to Ga and the ratio of As to Sb.

The method and apparatus provided may also include using indirect band gap semiconductors such as silicon and germanium and their alloys. Such materials typically show a longer carrier lifetime than direct band gap semiconductors. This tends to increase the efficiency of the p-n junction, electric generator embodiment and of the embodiment storing carriers.

The method and apparatus provided may also include operating the diode with a bias to enhance resonant tunneling. One way to do this when electron transfer dominates is to operate the diode with a bias such that the conduction band of the semiconductor matches an energy level of the adsorbates on the conducting surface. When hole transfer dominates, matching of the valence band is appropriate. Direct band gap semiconductors such as those from the InGaAsSb family may also be used. Direct band gap semiconductors permit configurations that extract energy by radiation and by stimulated emission of radiation.

In one aspect, the conducting surface may be formed on the metal contact of a Schottky diode. Hot electrons will then migrate through the metal. Those with enough energy may surmount the Schottky barrier and enter the n type semiconductor of the diode. Once in the semiconductor the hot electrons loose energy by collisions with the lattice and become trapped on the semiconductor side and become majority carriers and forward bias the diode, producing electricity. Useful electric generation occurs when the rate of carriers into the diode is sufficient. This fluence corresponds to a surface power density of order greater than approximately 1 watt/cm2.

The method and apparatus provided may, therefore, include forming Schottky junction diodes. In one aspect, these junctions may be formed with barrier potential high enough to permit useful forward bias, which barrier is typically in excess of 0.05 volt. The band gap of the Schottky junction may be any useful value, including values in excess of 5 volts, which are typically greater than the energy of the hot electron. Varying the semiconductor bandgap (via composition gradients) and doping levels permits reducing the thickness of the barrier and also permits changing of the relative Fermi levels with distance from the metal side of the diode.

A Schottky diode described may include metal, pinned-level, low doped semiconductor, high doped semiconductor, and may be tailored to exhibit a desired barrier potential at the metal-low doped junction and a desired barrier at the low-doped high-doped junction. A thin barrier permits electron tunneling, which in turn permits forming an almost ohmic junction when doping approaches degenerate doping.

Forming Schottky diodes with variable bandgap and variable doping provides a way to control and form a barrier potential on the semiconductor side without disturbing the pinning or other properties of the metal contact side. Variable bandgap may be achieved by varying semiconductor alloy composition as a function of distance from the metal surface. This method allows diodes to be constructed with desired and tailored barrier and Fermi level properties. Operating a low barrier device with high peak power may increase its efficiency as should be known to those skilled in the art, permitting such low Schottky barriers as those of order 0.05 to 0.1 eV.

In one aspect, oxide layers with thickness between 0.1 and 20 nanometers may be selected to form Schottky barriers and to permit better control of the barrier. Varying the thickness of the oxide controls the carrier tunneling through the oxide and hence the desired property of the junction. The oxide may be placed anywhere between the energized products and the semiconductor.

Similarly, the energetic charge carriers may be transferred or injected into a semiconductor or into a quantum well system. Such systems may in turn either convert the carriers into electricity or emitted radiation or may transfer the carriers to other locations for conversion into useful forms or for use in chemical processes.

In another aspect, the resulting electron energy is efficiently collected and converted into an inverted population of excitations in a semiconductor or in a quantum well, which excitations maybe converted into other useful forms of energy.

Yet in another aspect, the method and apparatus provided creates the conditions on a conducting surface where the excited molecule interaction with the surface strongly favor the generation of hot carriers or excitations rather than energizing substrate vibrations, also referred to as phonons. Such favorable conditions are created by tailoring the quantum states of the Fermi surface by the use of quantum wells to match excited molecule states, for example, by use of one to tens of atomic metal monolayers of metal to form the conducting surface.

Surface materials such as metals that tend not to acquire adsorbates and hence to favor energetic electron transfer, such as noble metals gold and silver may be selected. For reaction surface geometries, geometries with enhanced concentration of the reaction sites favoring excitations, such as molecular or atomic surface steps and edges may be selected. Further, material of the conducting surface may be selected to have phonon bands with energy much lower than the multi-quantum vibrational relaxation. A conducting surface composed of heavy atoms such as a palladium or platinum may exhibit such bands. Nearly all crystalline materials have the desired phonon band frequencies.

Reaction surface geometries, e.g., may include steps and/or edge sites which may enhance reactions or may include monolayer surfaces which may inhibit reactions. In one aspect, materials with Debye frequencies as far as possible from the desired excitation frequencies may be selected.

A highly energetic relaxation of a reaction product created in the vicinity of the conducting surface may also include a resonant tunneling of its energy into the energy levels of the substrate. These energy levels include the very broad band of available, unpopulated electron excitation states in either metals or semiconductor conduction bands. These energy levels may include a similar band of hole states, when the excitation transfer due to energized products is a hole.

The emission of the electron or hot carrier by interaction of excited molecule with conducting surface may utilize known inverse process such as Desorption by Electronic Transitions (DIET) or Desorption by Multiple Electronic Transitions (DIMET).

In one aspect, a conducting surface is formed thin enough so that the excited carrier produced in this way will transfer its energy to the energy converter substrate with minimum energy loss. The thickness of the conducting surface may be between one and thousands of monolayers of material, which thickness is an engineering parameter that depends on electron energy, lattice temperature and material, and can be fabricated according to the current state of the art.

In one aspect, the conducting surface may be formed so thin that the hot carrier, an electron or hole, travels into the energy converter, i.e. semiconductor, before it looses very much of its energy. The dimension associated with this ballistic transport is approximately a small multiple of the energy diffusion length of the hot carrier in the conductor or substrate. The "small multiple" means that the thickness is thin enough so that the hot carrier or excitation does not loose so much energy that the remaining energy is an impractically low value. Typically, the energy diminishes exponentially with the square of characteristic dimension "energy diffusion length." A distance of "3" energy diffusion lengths means that less than 5% of the carriers have approximately the same energy as when they started.

The energy diffusion length dimension is typically between 10 and approximately 1000 monolayers for conducting surface metals in the noble metal group, such as gold and silver, at room temperature, which is the equivalent of approximately 3 and 300 nanometers. The energy diffusion length can be in excess of 11 nanometers in gold for electrons with energy less than 1 eV and is calculated to be in excess of approximately 150 nanometers in silver for 1 eV electrons at room temperature.

The dimension of the material between the reactants and the semiconductor substrate, through the conducting surface, may be chosen to be less than the skin depth associated with a radiation transferring the energy. This embodiment uses an "evanescent wave", where electromagnetic fields transfer the energy. In this embodiment, instead of electron emission and re-adsorption, the internal energy of the energized reaction products is resonantly transferred to the carriers of the semiconductor or quantum well through the intermediate materials such as the conducting surface and underlying substrate. This type of transfer may be resonant transfer.

An energy converter captures the charge carriers or electromagnetic energy emitted by the energized products on or in close proximity to the conducting surface and converts them into a useful form. In one aspect, a semiconductor diode junction, such as p-n junction or a Schottky junction used as the energy converter. Alternatively, other known energy converters may be used. Such known energy converters may include any known device designed to capture the charge carriers or electromagnetic energy emitted by the energized products on or in close proximity to the reacting surface, such as devices used in photovoltaic energy converters, metal-insulator-metal devices, metal-oxide-metal devices, quantum wells and semiconductor devices. See for example, Tiusan, C.; et al., Applied Physics Letters, Volume 79, Number 25, 17 December 2001, "Quantum coherent transport versus diode-like effect in semiconductor-free metal-insulator structure" See for example, Elena A. Guliants, et al., Applied Physics Letters, Feb. 25, 2002, Volume 80, Issue 8, pp. 1474–1476, "A 0.5-$\mu$m-thick polycrystalline silicon Schottky diode with rectification ratio of 1E6."

As described above, chemicals reacting in a volume produce internal energy that are transferred to a surface or to an energy converter. Useful fraction of the chemical energy is converted into some other useful form. In one aspect, chemical reactants are used to create energized molecules efficiently, at useful rates. Examples of useful forms include hot electrons, hot holes, electromagnetic radiation, energized phonon modes, energized chemical forons, and energized piezoelectrics.

FIG. 1 shows a cross section of an apparatus where a reaction region generates energized molecules and a separate collection region collects the energy from the energized molecules. The reaction region 116 causes fuel 112 and oxidizer 113 to react and hence create energized molecules 101. The energized molecules 101 diffuse through the reaction region 115 and travel to the collection region 114, which includes the converter elements, and where energized molecules come in contact with optional catalyst 102 and conducting surface 103 of the collection region 114 where an energy transfer occurs. Converter elements may include optional catalyst 102, conductor 103, interface conductor 110, interface semiconductor 111, p-type semiconductor 104, semiconductor junction 105 and n-type semiconductor 106, negative electrode 107 and positive electrode 108.

A reaction region 115 and 116 including its related elements, for example stimulators 117, 118 and 119, is used to generate the energized molecules 101, and a collection region 114 including its related converter elements collects the energy from the energized molecules 101. The reaction region 115, 116, and stimulators 117, 118, 119 cause fuel 112 and oxidizer 113 to react and hence create energized molecules 101 that diffuse rapidly to and contact with the conducting surfaces 102, 103 near a collection region 114. An energy transfer from chemical to hot electron may occur on the optional catalyst 102, on the conducting surface 103, and/or in semiconductor structure 104, 105, 106. Another energy transfer of hot electron also occurs from the conducting surface 103, to interface conductor 110 and interface semiconductor 111 and into a semiconductor diode, for example p-type semiconductor 104, junction 105 and n-type semiconductor 106 with which it is in contact. Yet another type of energy transfer, for example, radiative, near field, evenascent wave radiation, may occur between excited state chemical products 101 and the semiconductor diode. Stimulators 117, 118, 119 in the reaction region 116 may consume electricity in process of reaction stimulation.

In one aspect, the catalysts 102, 118 may be formed in any one of many different configurations, each configuration having particular features. The catalyst may be formed in any way including but not limited to clumps, monolayers, clusters, ridges, step edges, quantum dots, quantum wells and quantum stadia. Configurations with edges and ridges promote active sites for adsorption and reaction. Configurations with monolayers may show the advantage of tailoring and causing resonances and peaks in the density of states of electrons near the Fermi surface, enhancing the transfer of energy at those energies. Clusters may enhance ballistic electron lifetimes and decoupling from surface phonon states, increasing efficiency.

As shown in FIG. 1, the collecting region maybe a diode 104, 105 and 106. The energized molecules 101 diffuse rapidly through the gas in a diffusion region 115 to a collection region 114, where they are converted into useful forms such as electricity. De-energized molecules 109 diffuse away from the collection region and may also be referred to as exhaust.

In another aspect, the reaction region 116, 115 may be located in a region separated from the collecting region 114 including a conducting surface 102, 103, but on the same structure, for example, on the same substrate. The plane of the illustration may represent the common substrate for this embodiment. In this configuration, the reaction region 115, 116, which includes catalysts and/or reaction stimulators 117, 118, 119, may be located at one part of a substrate and the collection region 114 including the converter elements on another. Separated regions will also be described with reference to FIG. 7.

The reaction region 115, 116 may be designed so that the intended fraction of the resulting energized molecules created in that region diffuse, migrate or are conveyed to the collection region 114. It is understood by those skilled in this art that even though the most desired fraction approaches unity, the intended fraction will be a result of engineering design. Such a design, for example, may choose relatively smaller reaction regions arranged among or partly enclosed by relatively larger collection regions.

In another aspect, the reaction region 115, 116 may include different kinds of reaction region, each processing the fuel 112 and oxidizer 113 in a different way, eventually producing energized molecules at the collection region 114 and exhaust 109 leaving the regions. Yet in another aspect, a reaction region 115, 116 may generate the energized molecules using volatized or gaseous fuel and oxidizer reactants.

The distance between reaction region 116 and collection region 114 is designed to be short enough that the vibrational excitations of the energized molecules is substantially retained. Energized molecules travel by gas diffusion between the two regions. Interactions with other gas molecules eventually will rob the excitation energy, generating heat. The distance may typically be designed to be less than 4 times the vibration energy diffusion length. This diffusion length is known to be typically longer than the collision mean free path by a factor of 3 to 100 (vibration diffusion length=collision mean free path×square root of 3 times vibration lifetime in units of time between collisions, with vibration lifetime typically between 10 and 10,000). The collision mean free path for air molecules, by way of example, is of order 100 nanometers. This means that the distance between reaction region and collection region may be a factor of 3 to 100 times longer than 100 nanometers. Therefore the reaction region may be formed such that the distance from the energized molecules to the collection region is less than approximately 4 times the diffusion length of the vibrational energy modes of the molecules.

In another aspect, the method includes forming the conducting surface in contact with the semiconductor region.

The term "contact" includes configurations where another conducting surface, catalysts, materials, oxides or metals are placed between the energized molecules and either the conducting surface or the underlying semiconductor and used as a path for the energy transfer. This includes placing the conducting surface near the reacting region. In one embodiment, "near" means within the distance that electronic excitations may travel such that more than 5% of the excitations retain more than 15% of their energy, or where resonant tunneling may transport the energy sufficiently fast that the no more than 85% of the energy is lost. The method also includes placing the conducting surface on, adjacent to or under the reacting surface. This includes such configurations as deep V channels and mesa structures.

In another aspect, a path of material may be formed for ballistic charge carrier transport in the conducting surface. Such path may be limited to a length less than approximately 4 times the energy diffusion length of the charge carrier. Yet in another aspect, part of the path may be formed from materials including any of metals, semiconductors or insulators, and materials with energy diffusion lengths in excess of 1 atom layer.

The method provides a short path from the surface facing the reactants to the semiconductor. The length of this path is preferably less than 4 times the energy diffusion length of the hot electrons or hot holes produced by the energized products. This path may also be made of catalyst metal, as an option. When the path is made from good conductor metals such as copper, aluminum, silver and gold the appropriate energy diffusion length thickness may be substantially greater than in catalyst such as platinum, palladium, iridium, rhodium, ruthenium, vanadia, titania, alumina, ruthenium oxide, oxides and other compounds. The thickness of materials forming the electrode may typically range from 0.3 to 300 nanometers, equivalent to approximately 1 to 1000 monolayers. The thickness of materials forming the catalysts may typically range from 0.3 to 50 nanometers.

In one aspect, the apparatus provided may include a substrate 102, 103, 110 comprising oxides, insulators and mixed catalysts, including but not limited to platinum, palladium, iridium, rhodium, ruthenium, vanadia, ruthenium oxide, oxides and other compounds, whether or not these compounds are catalysts, insulators or conductors. For example, the substrate may include ruthenium oxide, which is both an oxide and a conductor.

In one aspect, the semiconductor is chosen to be p-type when the hot carrier is an electron. The p-type semiconductor 104 is physically connected to the conducting surface (110 and/or 111) so that any potential barrier between them is very small or non-existent. For example, the conducting surface 110 may be placed on a thin electrode metal 111, and the electrode material 111 is bonded on the p-type semiconductor 104. The electrical barrier in a metal—metal contact 110, 111 is almost always negligible. The material discontinuity between 110 and 111, on the other hand, may place a desired barrier against phonon transport, and hence against heat transport.

Highly doping the semiconductor 104, including the limit of high doping called degenerative doping, and selecting the electrode material 110 or 111 from the ones known to be compatible with forming an electrical contact to a semiconductor reduces the Schottky barrier between an electrode and a semiconductor. The electrode material 111 may also be another semiconductor, which is a method routinely used in the state of the art of semiconductor device fabrication. The result is that the conducting surface Fermi level and the Fermi level of the p-type semiconductor valence band (the top edge of the lower band) are equal. The hot carrier energy is measured relative to that of the conducting surface Fermi level. The result is that some hot carriers approach the semiconductor with an energy above that of the conducting surface Fermi level and therefore with approximately the same energy above the Fermi level of the p-type semiconductor.

The hot carrier then tries to enter the semiconductor 104 with an excess energy above that of the conducting surface 102, 103 and/or 110 and semiconductor 104 valence band. By this design, there are practically no energy levels inside the band gap of the semiconductor for an electron to excite. The only levels available to the hot electron in the semiconductor 104 are in the upper band, the conduction band.

In one aspect, the location of this upper band is chosen to be slightly less than the dominant energy of the electrons, so the electron can readily enter the semiconductor 104. This is achieved by fabricating the band gap of the semiconductor 104 to be less than a chosen energy of this hot electron spectrum, or by choosing a semiconductor with the desired band gap. This means that a desired fraction of the hot electrons enter the p-type semiconductor 104 in its conduction band. This energizes the conduction band of the p-type semiconductor 104. The electron is thus converted into a minority carrier instead of a ballistic carrier. The minority carrier typically has a lifetime orders of magnitude longer than that of the ballistic carrier.

In another aspect, the semiconductor is chosen to be n-type when the hot carrier is a hole. The complimentary process as described with reference to p-type semiconductor is performed, producing the same result, i.e., the short-lived carrier is converted into a longer-lived carrier. Advantageously, semiconductor materials with both indirect and direct band gaps are available with energies from the lowest practical, of order 0.05 eV to higher than the bond energies of most reactants, well in excess of 3 eV.

The lifetime of a minority carrier in a semiconductor is typically at least 100 times longer than that of a ballistic carrier. This longer lifetime gives the hot, minority carrier a chance to migrate, diffuse or be attracted by the semiconductor internal field to a region in the semiconductor of opposite type, namely an n-type semiconductor. The p-n junction creates a strong electric field across it and attracts minority carriers approaching it.

At the semiconductor junction, the minority carrier in the semiconductor finds exactly the same situation as it would find in a photovoltaic diode. As in a photovoltaic diode, the electric field of the p-n junction sweeps the hot carrier across the junction, forward biases the diode and generates a useful electrical potential.

In one aspect, the p-type semiconductor 104 diode layer thickness is chosen to be smaller than the energy diffusion length of the minority carriers transporting the energy. This kind of mean free path is often referred to as the diffusion length. Over distances longer than the diffusion length the carriers eventually recombine and generate heat. Such diffusion lengths are typically of order 200 nm or more.

The diode 104, 105, 106, in one aspect, may be similar to a photovoltaic diode, but different in a key, non-obvious way. The known photovoltaic diode must be formed with a region near the junction large enough to collect the light passing through it. This is typically much larger than a few hundred nanometers. To increase the light collection distance, the semiconductor junction must contain at least one relatively lower doped region. This constraint forces the doping of either the n or p region of the photovoltaic diode to be much less than what is considered to be heavy doping or degenerate doping. This lower doping level reduces the resistance area product of the diode and hence reduces its efficiency.

Unlike the known photovoltaic diode, the diode 104, 105, 106 does not need to collect such photons and does not need a large photon collection region. Therefore, the diode 104, 105, 106 in the apparatus does not need one or the other polarity region of the semiconductor to be low doped. The diode 104, 105, 106 may, therefore, use the highly doped or degeneratively doped semiconductor as a free parameter of engineering design. This doping maximizes the resistance area product and, therefore, maximizes the diode efficiency. Therefore, the diode 104, 105, 106 may have both n 106 and p 104 regions that are highly or degeneratively doped. Unlike in a photovoltaic diode, high doping increases the energy collection efficiency of the diode. High doping also increases the electric field tending to sweep the injected minority carrier across the junction 105.

Accordingly, the semiconductor 104 may be degeneratively doped to a shallow depth, for example, 0.1 to 0.5 microns (100 to 500 nanometers). Highly doped and degenerative doped semiconductors may be used to minimize the distance from the conductor 110, 111 to the surface of the diode 104, where the hot carriers are generated, to the p-n junction 105, where the forward bias is developed. Thus the high doping and small p-n junction dimensions become a useful method. The high doping also permits use of relatively thin semiconductors, such as semiconductors less than 1 micron thick. It also permits convenient doping practices.

The method and apparatus provided produces practically useful efficiencies (in excess of 20%) and may be achieved with energized molecule power densities as low as of order 10 watts per square centimeter. The efficiency of the diode sharply increases with power, so that using more than 10 watts per square centimeter may result in much higher efficiency than at 10 watts, e.g. a nonlinear advantage.

Figure 2:
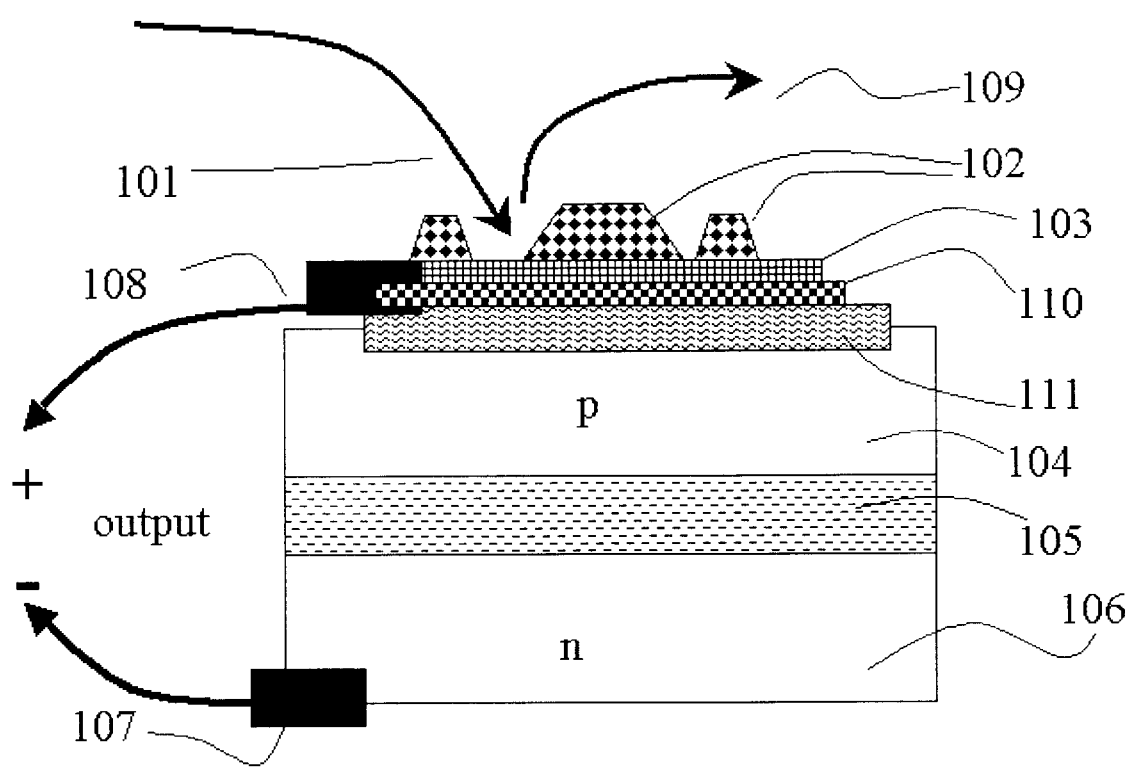
FIG. 2 shows a schematic cross section of the energy converter portion of an apparatus using the p-n junction option to generate a useful electrical potential from energized molecule energies.

FIG. 2 shows a cross section of the energy converter portion of an apparatus in one embodiment of the invention. In this embodiment, gas phase energized molecules 101 create hot energetic electrons which travel into a p-n junction semiconductor diode 104, 105 and 106, forward biasing it and generating electricity. As shown, energized molecules 101 flow on to the conducting surface 102 and 103. De-energized molecules 109, also referred to as exhaust products, leave the conducting surface 102 and 103 region. Hot electrons are produced as a result of the gas-surface interaction and forward bias the semiconductor diode formed by p type semiconductor 104, p-n junction 105 and n type semiconductor 106.

The conducting surface includes optional catalyst 102, conducting material 103, optional interface conducting electrode 110, and optional interface 111, such as a p type semiconductor. The conducting material 103 forms a substrate for an interaction with energized molecules 101. Optionally, the optional catalyst structures 102 may be formed on this conducting material 103.

Optional interface conducting electrode 110 and optional interface p type semiconductor 111 are shown to illustrate that material constraints may force the need for different types of materials. For example, one type of conducting material 103 may be needed for optimal interaction with energized molecules 101. Another type of conducting material 110 may be needed to form an ohmic or almost ohmic connection to a semiconductor 111. This ohmic connection may be needed for the ohmic connection to the diode semiconductor 104. When materials are compatible, material 102, 103 and 110 may be formed from the same material, such as a conductor. The diode material 111 and 104 may be also be the same.

For example, when the semiconductor 111 is very heavily doped, also referred to as degeneratively doped, catalyst 102 or metal 103 or 110 may form an ohmic junction or an almost ohmic junction to the semiconductor 111. In this case, a catalyst 102 or a conductor 103 may act as the substrate 110 to connect the conducting surface to the semiconductor diode.

The hot electrons created on the conducting surface 102 and 103 are ballistic majority carriers in the conductors. Those electrons with energy sufficient to enter the semiconductor conduction band travel into the p-type semiconductor 104 where the electrons are converted into minority carriers. Charge balance occurs by the transfer of a low energy hole to the p-type semiconductor 104 from the conducting surface 102 and 103. The minority carriers travel to the p-n junction 105 of the diode both by diffusion and by reason of the internal electric field of the junction 105. The internal electric field causes the carriers to become majority carriers in the n-type semiconductor 106 of the diode, causing the diode to become forward biased. The forward bias developed across the diode generates electricity. This electricity is extracted as a forward current between the positive electrode 108 and the negative electrode 107.

Referring to FIG. 2, in another aspect, the reaction region near 101, 109 and near 102, 103 may include a surface of the collection region 102, 103. Catalysts included in 102 and/or reaction stimulation mechanisms included in 102 co-located with the conducting surface 102, 103 are used to cause fuels and oxidizers 101 to react and for products 109 including energized molecules 109 to be formed on the conducting surface 102, 103, in the volume region above the surface 102, 103 and near 109, or in the immediate vicinity of that surface 102, 103. The term "near" means within several diffusion dimensions of energetically excited products in the product stream 109, as explained in this disclosure.

Figure 3:
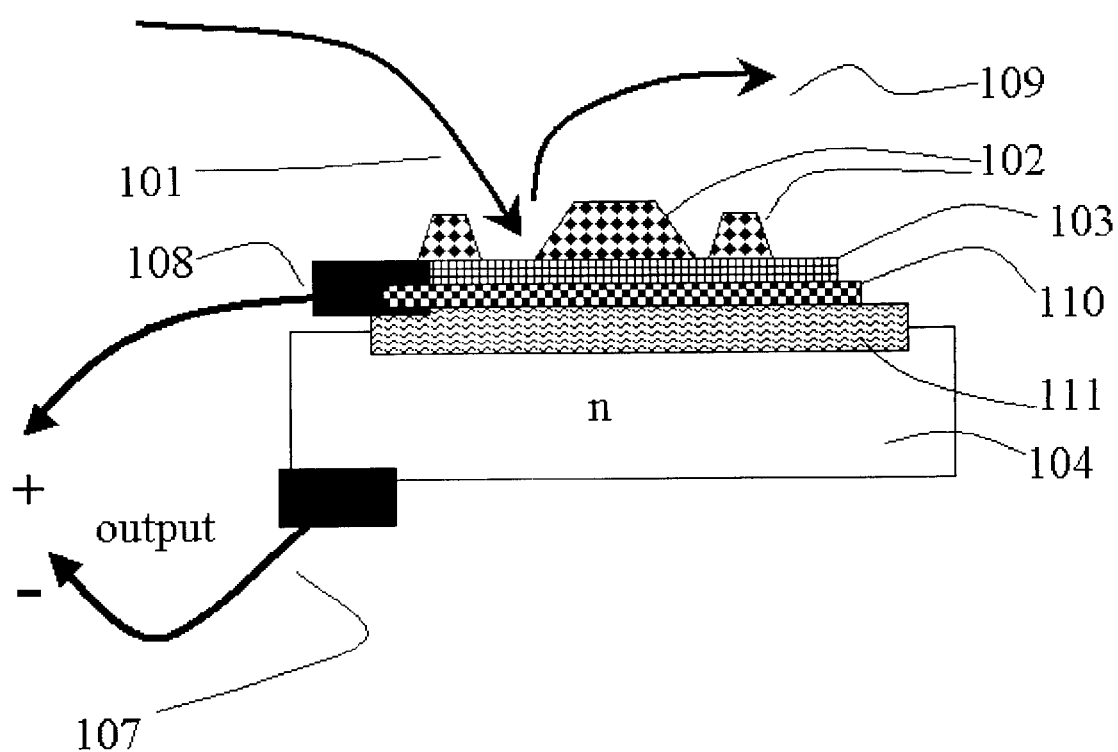
FIG. 3 shows a schematic cross section of the energy converter portion of an apparatus using the Schottky junction option to generate a useful electrical potential from energized molecule energies.

FIG. 3 shows a cross section of an energy converter portion of the apparatus for the case where the energized molecules create hot energetic electrons which travel into a Schottky junction semiconductor diode, forward biasing it and generating electricity. Gas phase energized molecules 101 flow on to the conducting surface 102 and/or 103. De-energized molecules 109, also referred to as exhaust products, leave the conducting surface region. Hot electrons are produced as a result of the interaction. Hot electrons with energy above the Schottky barrier travel into the semiconductor diode 110, 111 and 104 and forward bias it. The diode 110, 111 and 104 is formed by the junction of the conducting surface 110 and the n type semiconductors 111 and 104.

In another aspect, the conducting surface may include optional catalyst 102, conducting material 103, optional interface conducting electrode 110, and optional interface n type semiconductor 111. Optional interface conducting electrode 110 and optional interface n type semiconductor 111 are shown to illustrate that material constraints may force the need for one type of conducting material 103 facing energized molecules 101 and for another type of conducting material 110 facing semiconductors 111 and 104. The conducting material 103 forms a substrate for the preferred interaction with energized molecules. The optional catalyst structures may be also formed on the conducting material 103. The conducting material 110, which may be of another type, is used to form Schottky junction to a semiconductor 111. Semiconductor 111 and semiconductor 104 may in some designs be the same. When materials are compatible, the materials for catalyst 102, substrate 103 and electrode 110 may be formed from the same material such as a conductor. For example, a catalyst or metal may form a Schottky junction to the semiconductor. In this embodiment, a catalyst 102 or a conductor 103 or 110 may act as the electrode 110 to connect the conducting surface to the semiconductor diode.

The hot electrons created on the conducting surface 102, 103 and 110 are ballistic majority carriers in the conductors and travel into the n-type semiconductor 111 and 104 where the electrons are also majority carriers. In the process, the electrons loose energy to heat approximately equal to the difference between their initial energy above the Schottky barrier and the Fermi level of the n type semiconductor.

Collisions with the lattice and electrons in the semiconductor degrade the excess energy to a value substantially less than the barrier. The result of this energy loss is to diminish the number of electrons that travel in the reverse direction. This permits a forward bias on the diode to develop.

Charge balance occurs by the transfer of a hole from the conducting surface 110. The electrons cause the diode 110, 111 and 104 to become forward biased. Electricity is generated by reason of the forward bias developed across the diode 110, 111 and 104 and is extracted as a forward current between the positive electrode 108 and the negative electrode 107.

The substrate 110 may be a conductor chosen to form a Schottky barrier at the metal-semiconductor junction. The substrate 110 therefore may also form the electrical connection to the diode, also referred to as the diode electrode.

Figure 4:
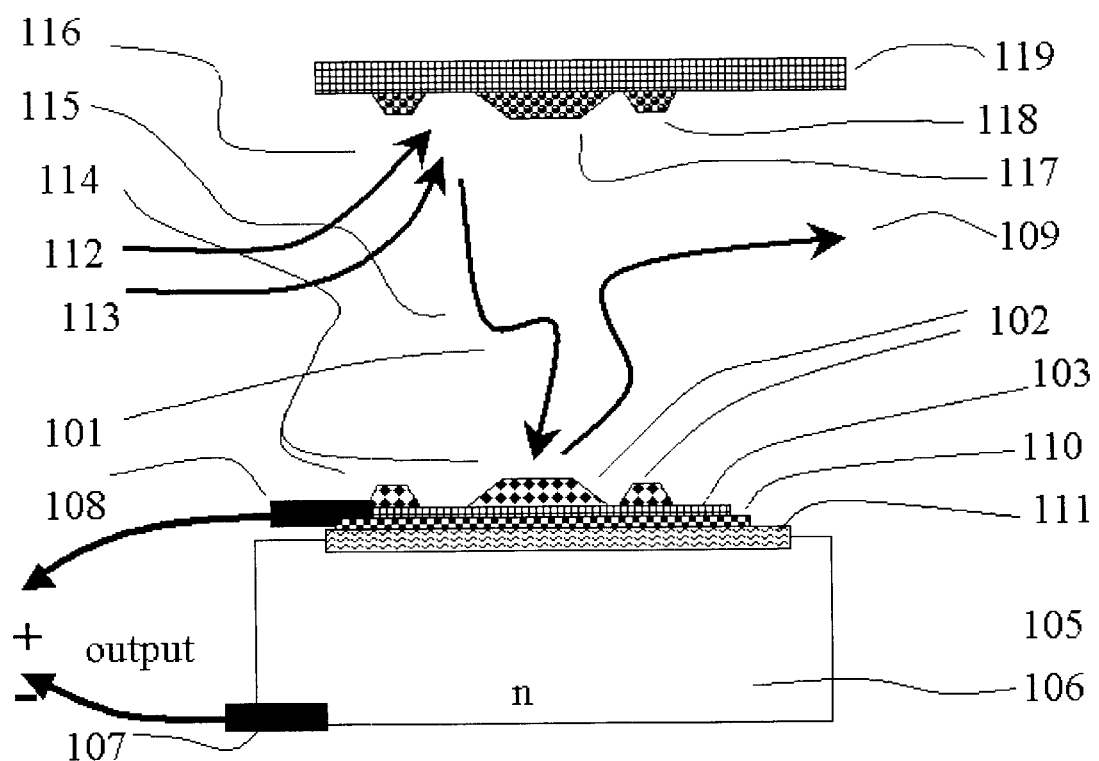
FIG. 4 shows a schematic cross section where a reaction region generates the energized molecules, a collection region collects the energy from the energized molecules and uses a Schottky junction to generate electricity.

FIG. 4 shows a cross section of an apparatus that is functionally similar to the device described with reference to FIG. 1. The difference is that the semiconductor diode shown in FIG. 4 is a Schottky junction instead of the p-n junction of FIG. 1.

In both devices of FIGS. 1 and 4, it may be readily concluded and observed that the physical location of the reaction region 116 may be any one of 1) identical to the collection region 114; 2) adjacent to the collection region 114 on the same substrate 102, 103 and 110; 3) near the collection region 114 on nano-structures or micro-structures near the collection region 114; 4) entirely separate from the collection region, or 5) comprising several different kinds of reaction stimulator in different locations.

In another aspect, the devices shown in FIGS. 1 and 4 illustrate how the physical separation of reaction region and collection region may facilitate thermal considerations. That is, the reaction region may be kept at a temperature much higher than the collection region by reason of the physical separations.

The reaction regions 116 shown in FIGS. 1 and 4 may be a thin cylinder, for example, shaped like a wire, surrounded coaxially by a collection region shaped as a cylinder or box of much larger dimension. The reaction region 116 may be a planar surface of the same dimension as the collection region, for example, as opposite sides of a box structure or opposite sides or walls of a channel structure. The reaction region 116 may be a set of wire-like regions separated from and above a sheet-like collection region 114 surface. The collection region 114 may be constructed as a plateau or post, surrounded by wire-like reaction region devices, point-like reaction regions. These configurations are only shown as examples of ways to separate reaction and collection regions. The configurations of FIGS. 1 and 4 show the generic concept of separated regions.

Referring to FIG. 1 and FIG. 4, in another embodiment the reaction region 115, 116 may be designed to operate at an elevated temperature relative to the collection region 114. The reaction region 115, 116 may include reaction stimulators 117, 118, 119 such as electrical, optical or chemical injection stimulators, which may require thermal isolation, electrical isolation, optical guides, and chemical injectors. The reaction region 115, 116 may include heat sinks, not shown in either figure, separate from that of the collection region 114. Heat may also be removed by convective action of the gas flow 109 through the reaction region 115, 116.

The reaction region 116 includes stimulators or catalysts. These may include a structure 119, electrical stimulators, optical stimulators, catalysts shown generally as 117, hot wires or structures shown generally as 118, and injected chemical stimulators such as autocatalysts and free radical generators or reaction stimulators. Examples of additive autocatalysts and free radical generators include use of additives such as hydrogen peroxide and methyl alcohol.

Figure 5:
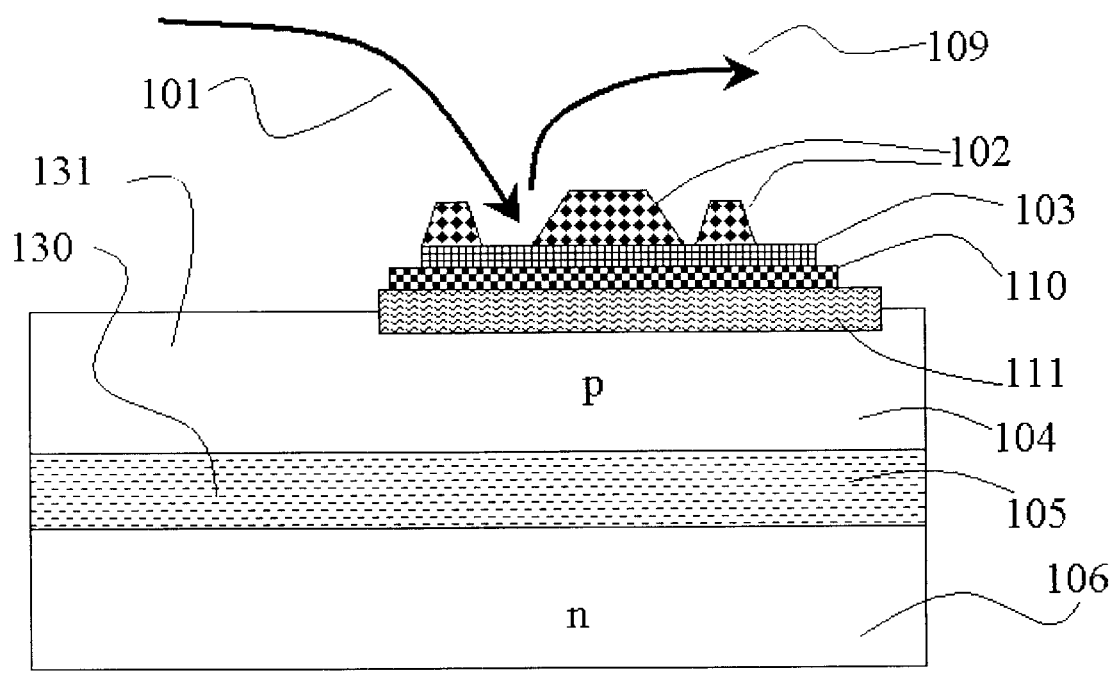
FIG. 5 shows a schematic cross section of a device that stores excitations created by excited molecules.

FIG. 5 shows a cross section of a device that stores excitations created by excited molecules. The device may be similar to one described with reference to FIG. 2. In the device shown in FIG. 5, the hot electrons may be used in other ways than generating electricity. The hot electrons originating from energized molecules form electrons in the p type semiconductor 104 and holes in the n type semiconductor 106 which diffuse to other regions 131 of the semiconductor, including along the junction 130. There, the hot carriers may be used for other purposes. In FIG. 5, the elements of the collecting region, reactants 101, exhausts 109, optional catalyst 102, conducting surface 103, interface conductor 110, interface semiconductor 111, p-type semiconductor 104, junction 105 and n-type semiconductor 106 may be functionally similar to those of FIG. 2.

The semiconductor region 106 shown as n-type may instead be p-type with lower doping than the p-type region 104, or the region 106 may be intrinsic (undoped). Application of electrical signals between the region 106 and the p-type region 104 may be used to control the movement and storage of the carriers.

In one aspect, semiconductor structures may be designed to store charge carriers resulting from the hot electrons. Such semiconductors may collect hot electrons in one region and permit the resulting longer lived carriers to diffuse to other regions. The invention may distribute the long lived carrier to other locations on the reaction surface. The transported carriers may then leave the semiconductor, convert back into a ballistic carrier in a conducting surface or reaction surface, and perform useful work. Such work includes stimulating reactions and energizing nano-mechanical devices or molecules. Examples of such nano-mechanical devices include a nano-propeller, a C60 transistor, and the biological material kinesin.

The carriers in other regions may cause a population inversion of electrons and holes in the semiconductor, or may cause a transport of the carriers to another surface for injection into that surface, or may cause a transport of the carriers to a region where they perform some other useful purpose.

Examples of other purposes include injecting carriers into a semiconductor to control currents such as in a transistor; re-injection of carriers from a surface of the semiconductor 131 into adsorbates on its surface or surfaces connected to it to cause chemical reactions or to energize the adsorbates to become more reactive or to become energetically excited; causing chemical reactions; controlling chemical reactions; stimulating reactions; energizing surface adsorbates into excited states; energizing surface plasmons; injection of carriers into piezoelectric or electrostrictive elements to cause conversion to mechanical motion; causing a population inversion so as to cause optical emission; injection into quantum well structures to cause electromagnetic emissions; energizing semiconductor circuits; and/or conversion to other forms including phonons.

Figure 6:
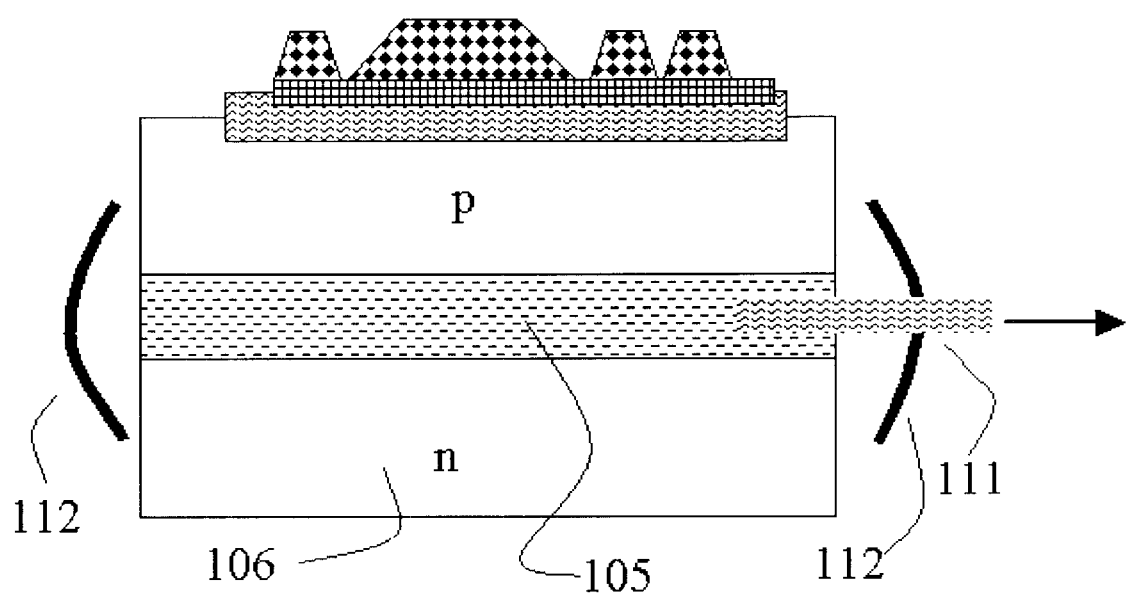
FIG. 6 shows a schematic cross section of a device that converts excitations created by excited molecules into a population inversion.

FIG. 6 shows a cross section of an apparatus functionally equivalent to that of the device described with reference to FIG. 5. In the device shown in FIG. 6, the use of the carriers in the semiconductor p-n junction 105 is an inverted population. In this mode, the energy 111 is extracted from the diode in a fashion similar to that of a laser diode or a light emitting diode, where elements 112 represent optical elements. The operations of laser diode and light emitting diode is generally known to those skilled in the art, and therefore, will not be further explained herein.

Figure 7:
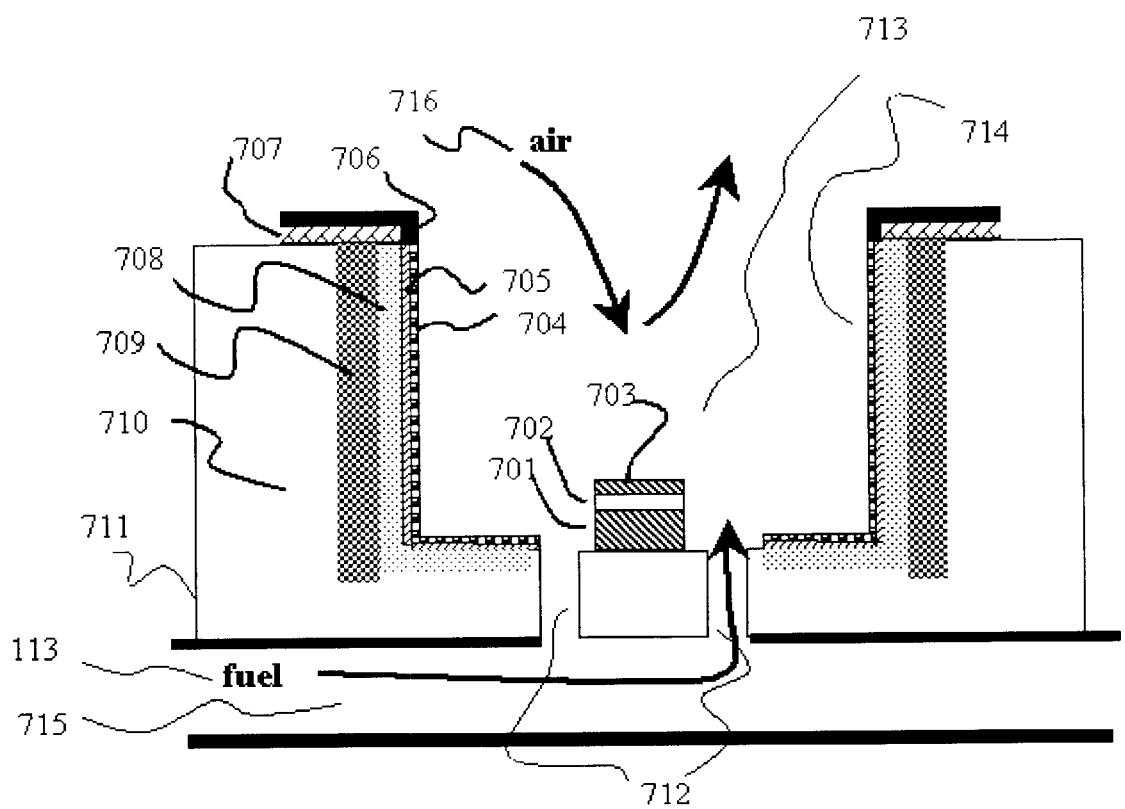
FIG. 7 shows a schematic cross section of a device with separate fuel and oxidizer channels, separated reaction and collection regions and thermal isolation.

FIG. 7 illustrates the apparatus with separate reaction and collection regions. The reaction region 713, which includes catalysts 703 and/or reaction stimulators 701, 702, may be located at one part of a substrate 710 and the collection region 714 including the conducting surface 704 and its associated semiconductor converter elements (including conducting surface 704, interface conductor 705, electrode 706, p-type semiconductor 707, juntion 708, n-type semiconductor 709, substrate 710) on another part of the substrate.

As shown in FIG. 7 the reaction region 713 may be designed relatively smaller than the collection region 714. The reaction region 713 may also be arranged among or partly enclosed by relatively larger collection regions 714. The catalyst 703 of the reaction region 713 also may be separated from the collection region 714, which partly encloses the reaction region 713.

Referring to FIG. 7, fuel channels 715 may be formed separate from air or oxidizer flow 716. This separation can take on many forms. For example, a collection region 714 may be formed with holes 712 that penetrate to an underlying source of fluid fuel 715. Fuel molecules 113 would thus dominate the adsorbed specie on the catalyst 703 or collection 714 regions. The catalyst-fuel assembly may be part of the collection surface 704 or it may be part of the reaction surface 703, or both.

The fuel and/or the heat of vaporization of a fuel may be used to cool the semiconductor energy converter, which may include, for example, conducting surface 704, interface conductor 705, electrode 706, p-type semiconductor 707, junction 708, n-type semiconductor 709, substrate 710. This is a novel way both to cool the semiconductor and to enhance the re-use of hot carriers that do not become converted into electricity. For example, referring to FIG. 7, a fuel 113 covering a catalyst or conduction surface 704 may absorb hot electrons that do not enter the energy converter semiconductor 708. Upon absorption, the fuel may then dissociate into active radicals and become part of a chemical reaction. The fuel or its dissociated products may desorb, with or without help of hot electrons, and mix with radicals in the reaction region 713. Fuel may also simply evaporate from regions 712 which are physically connected to the semiconductors 708, 709 and pass into the reaction region 713, cooling the semiconductors 708, 709. The high concentration of vaporized fuel 113 can therefore bias the fuel/oxidizer mixture in favor of an optimum mixture.

Figure 8:
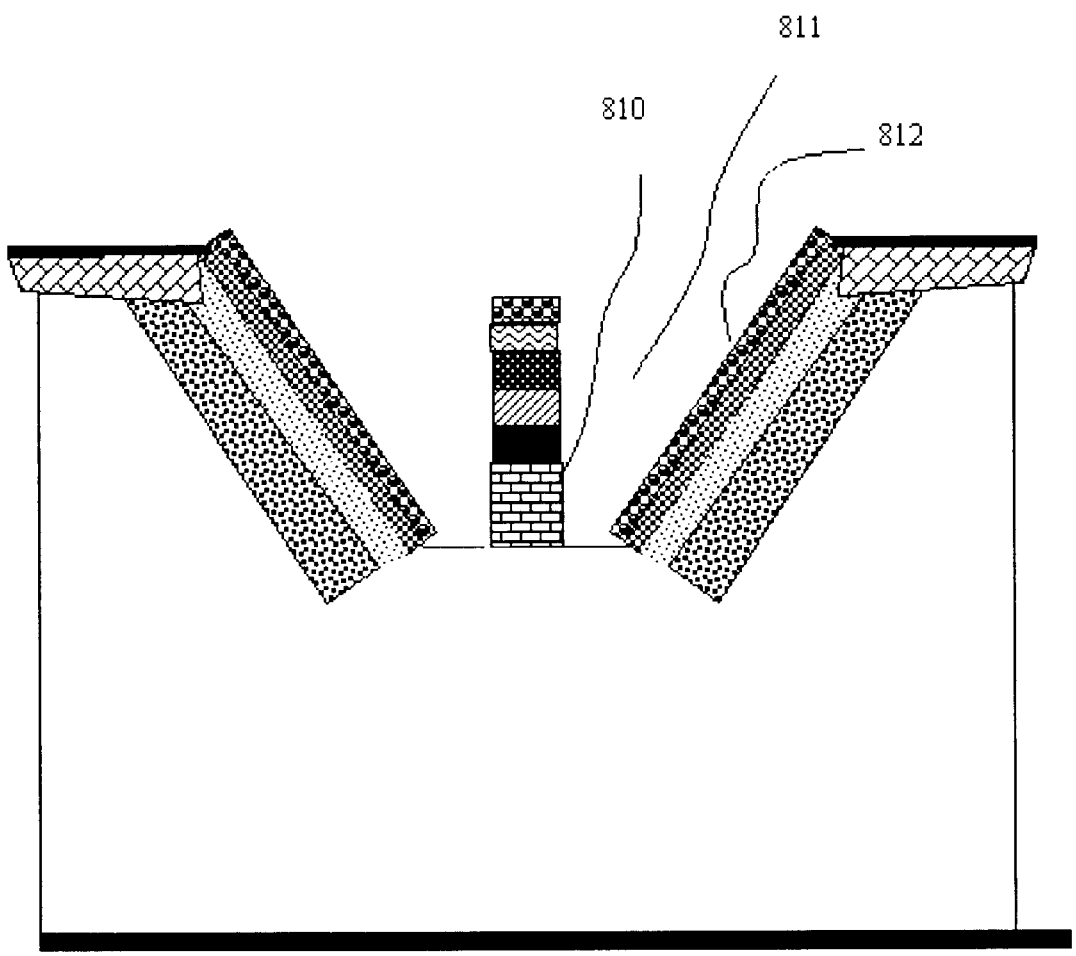
FIG. 8 shows a schematic cross section of a device illustrating thermal barriers and separated reaction and collection regions.

Referring to FIG. 8, thermal barriers 810 may be formed between the reaction 811 and collection 812 regions so that the reaction region 811 may operate at a higher temperature than the collection region 812. Such barriers may include pillars 810, vacuum or channels with reduced amounts of physical material. Heat sources may be connected to the reaction region 811 and heat sinks to the collection region 812 to keep the regions within their desired operating ranges. The reaction region 811 may be formed with elevated structures such as posts, plateaus and/or pillars 810. Structures may be designed to be thermally insulating.

Referring to FIG. 8, electrically insulating barriers 810 may be formed between the two regions 811, 812 so that electrical stimulation signals may be routed to the reaction region without interfering with the collection region. Other barriers and structures may be placed between the regions, for example to isolate or filter radiation, or to filter chemical by products, or to isolate molecules with various properties such a translational, rotational or compositional properties.

Using a Schottky junction as an energy converter may provide for simplicity in the device. Semiconductors with band gaps in the range of order 1 volt, such as silicon may be used. In one aspect, higher band gap semiconductors may be used and, therefore, permit the apparatus to be operated at a temperature above room temperature, e.g. above 100 Celsius. Commercially available high temperature semiconductors such as GaN and SiC are examples of such higher band gap materials. This expands the range of metals and semiconductors that may be used and results in increased extractable power per area.

In one aspect, energized molecules may be used to generate the carriers instead of an applied voltage for powering an external device. Energized molecules may therefore be used to power devices that would otherwise be powered by a source of electricity. For example, chemical reactions may also be used to power chips sets. Using chemical reactions to power chips sets permits the construction of volume, three dimensional computing systems, where the energy source to power them is a flow fuel-oxidizer mixture instead of electrical connections. This permits systems without physical interconnects and without any structural interconnects, for example, as in pebble bed reactor systems. Microstacks of electrical energy sources may be energized by the fuel-oxidizer mixtures, where such microstacks are part of the physically isolated "pebbles." This in turn permits self assembled volume systems, and greatly lowers their cost and increases their performance.

In another aspect, a quantum well is used and energized as the energy converter. An energy converter of the apparatus transforms a short-lived carrier into a longer-lived carrier so that the resulting carrier may be further used. A quantum well substrate including a tunneling barrier, a metal or semiconductor and another tunneling barrier may be used to form the energy converter. This energy converter may be also formed in direct contact with the substrate semiconductor. Another way the energy may be extracted may be through generation of a potential. Yet another way may be to power nanodevices directly connected to the invention. According to the state of the art, external electric currents have been used to energize quantum wells and dots formed into near ideal 4 level lasers. In the apparatus provided, the same kinds of wells and dots may be energized directly from the energy of injected carriers.

Quantum wells also offer the possibility of creating resonances to capture the energized molecule excitations. The resonance levels formed by the quantum well may be tailored to match selected multi-quantum transitions in the chemically excited products. Such a match provides a way to transfer energy from the excited products into the longer lived excitation of the quantum well. The method provided, for example, may extract the energy from the quantum well by stimulated emission of radiation.

The current state of the art associated with semiconductor or metal quantum well structures permits layers whose dimensions are, conveniently, less than or of the same order of magnitude as the energy diffusion length of the ballistic carriers involved, facilitating and enabling fabrication.

In one aspect, the conducting surface may include several materials. The surface is formed sufficiently thin, for example, with thickness less than 10 times the energy diffusion length for hot electrons, on a semiconductor structure such that hot electrons may enter the semiconductor before loosing a substantial fraction, for example, no more than 90%, of their energy.

The conducting surface and its underlying semiconductor may include catalysts and other reaction stimulation systems to cause chemical reactions of the energized molecules or to cause energy transfers either from or to the energized molecules. That is, the conducting surface may also be part of a reaction-stimulating surface energized by the application of energy, such as electricity.

The conducting surface and its underlying semiconductor may include catalysts and other reaction stimulation systems. These may be used to prevent adsorbates, such as fuels, oxidizer, exhausts, reaction byproducts, or other materials, from clogging, accumulating or interfering with the operation of the conducting surface, as is known to happen when non-conductors form or collect on the conducting surface. These catalysts and other reaction stimulation systems may also accelerate the reactions and may cause preferred reactions to occur.

While the invention has been particularly shown and described with respect to an embodiment thereof, it will be understood by those skilled in the art that the foregoing and other changes in form and details may be made therein without departing from the spirit and scope of the invention.

We claim:

1. A method for extracting energy, comprising:
   initiating one or more chemical reactions in a gas volume;
   producing one or more highly vibrationally excited reaction products in a gas phase;
   allowing the one or more highly vibrationally excited reaction products to collide on a surface of a substrate and to transfer vibrational energy associated with the one or more highly vibrationally excited reaction products to the surface in a form of hot carriers: and
   converting kinetic energy of the hot carriers into useful work.

2. The method of claim 1, wherein the one or more reaction products include one or more intermediate reaction products.

3. The method of claim 1, further including:
   collecting the kinetic energy of the hot carriers from the surface.

4. The method of claim 1, wherein the initiating one or more chemical reactions include
   stimulating one or more reactions in the volume by injecting one or more stimulants.

5. The method of claim 4, wherein the one or more stimulants include any one or more of catalyst, autocatalyst, hot carriers, electrical stimulant, optical stimulant, and additive.

6. The method of claim 3, wherein the collecting the kinetic energy of the hot carriers from the surface includes allowing the kinetic energy of the hot carriers to be transferred from the surface to a converter that converts the kinetic energy of the hot carriers into one or more forms of useful energy.

7. The method of claim 6, wherein the converter includes a diode.

8. The method of claim 6, wherein the useful energy includes any one or more of electricity, radiation, and mechanical energy.

9. The method of claim 1, wherein the producing one or more highly vibrationally excited reaction products includes allowing reactants in the gas phase to migrate by diffusion to react with stimulants in the gas volume near the surface of the substrate.

10. The method of claim 1, wherein the producing one or more highly vibrationally excited reaction products includes allowing reactants in the gas phase to migrate by diffusion to react with stimulants in the gas volume on the surface of the substrate.

11. The method of claim 1, wherein the useful work comprises electrical potential.

12. The method of claim 1, wherein the hot carriers include one or both of hot electrons and hot holes.

13. The method of claim 1, wherein at least part of the vibrational energy is transferred directly to the surface in a form of hot carriers.

14. An energy extracting apparatus comprising:
   a reaction stimulator for initiating a chemical reaction;
   a substrate forming a collection surface;
   a reaction volume formed between the reaction stimulator and the collection surface; and
   an energy converter in contact with the substrate,
   wherein chemicals in a gas phase react in the reaction volume and collide with the substrate, transferring reaction energy in a form of hot carriers from the products of the reaction occurring in the reaction volume into the substrate and the transferred energy is converted into a useful form of energy by the energy converter.

15. The energy extracting apparatus of claim 14, wherein the energy converter includes a diode.

16. The energy extracting apparatus of claim 14, wherein the energy converter includes a p-n junction diode.

17. The energy extracting apparatus of claim 14, wherein the energy converter includes a Schottky diode.

18. The energy extracting apparatus of claim 14, wherein the distance from the most distant part of the reaction volume normal to the collection surface is a multiple of the vibration energy diffusion length of the reactants.

19. The energy extracting apparatus of claim 14, further including a second reaction stimulator near the reaction volume.

20. The energy extracting apparatus of claim 19, wherein the second reaction stimulator includes any one or more of electrical stimulator, optical stimulator, catalysts, hot wire, and chemical stimulator.

21. The energy extracting apparatus of claim 20, wherein the chemical stimulator includes any one or more of autocatalyst and free radical generator.

22. The energy extracting apparatus of claim 14, wherein
   a region between the reaction volume and the energy converter is less than three times the mean free path associated with energy decay of the hot carriers.

23. The energy extracting apparatus of claim 14, wherein the substrate includes one or more atomic metal monolayers of one or more selected material.

24. The energy extracting apparatus of claim 23, wherein the one or selected material includes any one or more of metals and semiconductors.

25. The energy extracting apparatus of claim 14, wherein the collection surface has a geometry favoring excitation of molecules during a reaction.

26. The energy extracting apparatus of claim 25, wherein the geometry favoring excitation of molecules includes atomic surface steps.

27. The energy extracting apparatus of claim 25, wherein the geometry favoring excitation of molecules includes atomic edges.

28. The energy extracting apparatus of claim 14, wherein the substrate includes one or more metals that tend not to acquire adsorbates.

29. The energy extracting apparatus of claim 28, wherein the one or more metals that tend not to acquire adsorbates include any one or more of platinum, palladium, rhodium, ruthenium, gold, and silver.

30. The energy extracting apparatus of claim 14, wherein the substrate includes a conducting surface whose highest phonon frequency is less than a dominant vibrational transition energy of a vibrationally excited reactant.

31. The energy extracting apparatus of claim 30, wherein the conducting surface includes crystalline material.

32. The energy extracting apparatus of claim 30, wherein the conducting surface includes any one or more of palladium and platinum.

33. The energy extracting apparatus of claim 14, further including a channel formed from under and through the energy converter and the substrate to the reaction region, wherein any one or more of reactants and stimulants may be added using the channel into the reaction region.

34. The energy extracting apparatus of claim 33, wherein the any one or more of reactants and stimulants in the channel cool the energy converter.

35. The apparatus of claim 14, wherein the useful form of energy comprise electrical potential.

36. The apparatus of claim 14, wherein the distance from the most distant part of the reaction volume normal to the collection surface is less than three times the vibration energy diffusion length of the reactants.

37. The apparatus of claim 14, wherein the hot carriers include one or both of hot electrons and hot holes.

* * * * *